United States Patent [19]
Yenni, Jr. et al.

[11] 4,156,751
[45] May 29, 1979

[54] SHEET MATERIAL FOR FORMING ENVELOPES USED TO PROTECT ELECTRONIC COMPONENTS

[75] Inventors: Donald M. Yenni, Jr., Stillwater; Steven W. Knutsen, New Brighton; Edward J. Downing, St. Paul, all of Minn.

[73] Assignee: Minnesota Mining and Manufacturing Company, St. Paul, Minn.

[21] Appl. No.: 785,937

[22] Filed: Apr. 8, 1977

Related U.S. Application Data
[62] Division of Ser. No. 740,303, Nov. 9, 1976.

[51] Int. Cl.² .................. B65D 73/02; B32B 9/00
[52] U.S. Cl. ........................... 428/212; 206/332; 428/279; 428/409; 428/458; 428/918; 428/922
[58] Field of Search ............ 428/212, 922, 215, 458, 428/457, 409, 461, 279, 918; 427/209; 206/328, 332, 329, 524.1, 524.3

[56] References Cited
U.S. PATENT DOCUMENTS

| | | | |
|---|---|---|---|
| 3,679,468 | 7/1972 | Feinauer et al. | 428/922 |
| 3,764,376 | 10/1973 | Wagner et al. | 428/922 |
| 3,801,418 | 4/1974 | Cornelis et al. | 428/922 |

*Primary Examiner*—Michael W. Ball
*Attorney, Agent, or Firm*—Cruzan Alexander; Donald M. Sell; William L. Huebsch

[57] ABSTRACT

A flexible sheet material for forming an envelope used to enclose and protect electronic components from electrostatic charges during storage and shipment. The sheet material is sufficiently transparent to afford visual identification of an electronic component through the envelope, while including a polymeric sheet having a high volume resistivity to electrically isolate a component within the envelope, an antistatic material which is disposed at an inner surface of the envelope for dissipating and restricting electrostatic charges on components within the envelope, and a highly conductive layer which is then disposed on the outer surface of the polymeric sheet and provides a highly conductive outer surface on the envelope for grounding electrostatic charges brought into contact with the envelope.

10 Claims, 8 Drawing Figures

SHEET MATERIAL FOR FORMING ENVELOPES USED TO PROTECT ELECTRONIC COMPONENTS

This is a division of application Ser. No. 740,303 filed Nov. 9, 1976.

BACKGROUND OF THE INVENTION

The present invention relates to sheet materials used in forming envelopes for protecting electronic components such as metal oxide semiconductors from potentially damaging electrostatic charges before they are installed in an electronic circuit.

According to a Jet Propulsion Laboratory Report, as many as 60% of some manufacturers' metal oxide semiconductors have been damaged by electrostatic discharge during handling of the semiconductor from the time it is manufactured to the time it is installed in an electronic circuit. Thus much effort has gone into developing means for protecting such electronic components from electrostatic discharges prior to their installation.

Generally two different means for protecting such electronic components are presently in use. Either the leads of each component are shorted together via a metal or conductive plastic polymeric sheet member, or the entire component is enclosed in a protective envelope.

While shorting of the leads with a metal or conductive plastic member can be effective for many applications, removal of the device can be inconvenient during quality control inspection and installation of the component, and materials may be sloughed from the member which can contaminate some components for particular applications.

Prior art protective envelopes have also presented problems. One type of protective envelope has been made from a transparent, sheet material comprising an electrically non-conductive polymeric sheet both surfaces of which material have been made conductive (i.e. having a surface resistivity in the range of about $10^8$ to $10^{14}$ ohms per square) by either a special treatment on the polymeric sheet, a coating of an antistatic material on both surfaces of the polymeric sheet or by an antistatic material disposed throughout the polymeric sheet which antistatic material does not significantly increase the volume conductivity of the polymeric sheet. Such resistivity on the surfaces of the envelope, however, does not always allow the envelope to assume the electrostatic potential of a person opening the envelope before the component within the envelope is removed. This can result in a damaging electrostatic charge being transferred from the person to the component after the envelope is opened. Also, since charges on a person handling the envelope are not rapidly dissipated by the outer surface, they can be capacitively coupled through the envelope and damage a component therein.

Other sheet materials for forming protective envelopes have included volume conductive carbon loaded polymeric sheets or metal foils. Envelopes made from these sheet materials are opaque and therefore do not afford visual inspection and identification of an electronic component within. Contact between the component and the inner surface of the envelope will cause metal or carbon filled scrapings which can contaminate the component for some applications. Also such volume conductive sheet materials can conduct electrostatic charges to the component within the envelope. While these latter two problems have been controlled by using a polymeric bag over the component within the envelope, this presents still further problems in that the inner surface of the plastic bag will not dissipate charges on the component caused during manufacture, and further damaging charges may be developed during handling of the envelope by relative movement between the component and the inner surface of the polymeric bag.

SUMMARY OF THE INVENTION

The sheet material according to the present invention can be formed into a strong hermetically sealable envelope for protecting electronic components such as metal oxide semiconductors which envelope will (1) provide shielding for a component from external electrostatic fields, (2) afford a path to ground for external static electrical charges contacting the envelope, (3) provide a high impedance to prevent electrostatic charges outside the envelope from reaching the electronic component within the envelope, (4) afford draining of any electrostatic charges at the inner surface of the envelope that were developed during manufacturing and packaging, (5) restrict development of electrostatic charges due to relative movement between the semiconductor and the inner surface of the envelope and provide a high impedance path for the controlled discharge of such electrostatic charges should they occur, and (6) afford visual identification of the electronic component within the envelope; and (7) which envelope will not shed surface particles that may be considered contaminants in the electronic industry.

According to the present invention there is provided a flexible sheet material having first and second major surfaces. The sheet material is adapted for forming an envelope which can receive and electrically protect an electronic component, with the second surface of the sheet material defining the inner surface of the envelope, and the first surface defining the outer surface of the envelope, (i.e. the word "envelope" as used herein means any complete enclosure formed by one or more sheets of the sheet material which have their edges secured together, which enclosures may be of any shape required to enclose the component). The sheet material comprises a self supporting electrically insulating polymeric sheet which may consist of one or more layers; an antistatic material providing a resistivity on the second surface of the material (inner surface of the envelope) in the range of $10^8$ to $10^{14}$ ohms per square; and an electrically conductive layer on the surface of the polymeric sheet opposite the second surface of the sheet material which conductive layer provides a surface resistivity of no greater than $10^4$ ohms per square on the first surface of the sheet material. The sheet material has sufficient light transmission between its first and second surfaces so that an electronic component can be visually identified through the sheet material.

Preferably an envelope is formed from only one sheet of the sheet material to insure electrical continuity of the electrically conductive layer over the entire outer surface of the envelope and of the antistatic inner surface of the envelope.

While other means could be used for securing the edges of the sheet material together to form an envelope (e.g. adhesive bonding to clamping), preferably the polymeric sheet comprises a layer of thermoplastic heat sealable polymer such as polyethylene which layer can first be fused together in predetermined areas to form the envelope and can then be fused together along an open side of the envelope to complete a hermetic seal after an electronic component is placed therein.

The term "electrically insulating" as used herein means that the polymeric sheet provides sufficiently high impedance between the second surface of the sheet material and the conductive layer to prevent electrostatic charges outside an envelope formed of the sheet material from reaching the semiconductor within the envelope. A volume resistivity polymeric sheet on the order of $10^{15}$ ohm centimeters or above is considered adequate.

The antistatic material which provides the desired surface resistivity on the second surface may be coated on the polymeric sheet, but preferably is distributed throughout a layer of the polymeric sheet which then defines the second surface so that the antistat cannot be removed from the polymeric sheet through rubbing or scraping by the packaged component. The polymeric sheet may consist of only one layer with the antistatic material distributed throughout that layer since the antistatic material does not significantly increase the volume conductivity of the polymeric sheet. It is preferred, however, to provide a layer of polymeric material which does not include the antistatic material between the highly conductive layer and the layer of polymeric material and antistatic material to facilitate manufacture of the sheet material. Such layered polymeric sheets may be prepared by mixing the antistatic material with a polymeric material (e.g. low density polyethylene) and applying the resultant mixture to one surface of an antistat free polymeric material (e.g. polyester) by coating or extruding the resultant mixture onto the antistat free polymeric material, or by coextruding the resultant mixture with the antistat free polymer, or by forming the resultant mixture into a sheet and adhesively laminating the sheet to the layer of antistat free material.

However it is applied, the antistatic material increases the conductivity of the second surface of the sheet material in part by acting as a hemectant to collect water along that surface. Such collection of water by the antistatic material lubricates the inner surface of an envelope formed of the material to reduce friction and thereby restrict static electric charges developed by rubbing between the inner surface of the envelope and a component in the envelope. Also when more than one component is in the envelope the inner surface works in conjunction with the conductive layer to suppress and evenly distribute over the entire inner surface of the envelope any small voltages developed by rubbing between the components.

Preferably the polymeric sheet consists of one layer of polyester and a second layer which defines the second surface of the polymeric sheet of low density polyethylene (e.g. No. 3300 polyethylene as provided by Union Carbide Corp.) to which has been added 3% by weight of the antistatic material designated Ampacet 10069 and provided by Ampacet Corporation. Other conventional organic antistatic materials which may also be useful in polyethylene include quaternary ammonium compounds, polyethylene glycols and monoethers, ethanolamines, amine salts, and soaps.

Also, although polyethylene is preferred for its heat sealing properties other polymeric materials for which antistatic agents are described in the literature and which when combined therewith may be useful as part or all of the polymeric sheet include poly vinylidene chloride, copolymers of vinyl chloride and polyvinyl chloride, other polyolefins such as polypropylene, polyethylene terephthalate, polycarbonate, polyvinyl acetate, and cellulose polymers, all of which polymeric materials have a volume resistivity of at least about $10^{10}$ ohm-centimeters as reported in "Modern Plastics Encyclopedia", Oct. 1975, Volume 52, Number 10A.

The conductive layer is preferably of a metal or a metal compound in an amount per area sufficient to provide a surface resistivity of no greater than $10^8$ ohms per square, and preferably of less than $10^4$ ohms per square on the first surface of the sheet material; while still affording with the other layers of the sheet material a light transmissivity sufficient to afford visual identification of an electrical component through the sheet material (i.e. a light transmissivity of at least 25%, and preferably no less than 60%). Vapor deposition in vacuum by the electron beam method, is the preferred method of applying the conductive layer to the polymeric sheet, although sputtering or electroless plating may also be useful. Several metals are useful for the conductive layer, including nickel which is preferred for its relatively low cost and low resistivity of about 90 to 550 ohms per square in thickness providing from about 50 to 60% light transmission. Aluminum and copper are also useful, however corrosion of the conductive layer can present a problem when these metals are used. Inconel and chromium are also usable, but are not preferred because conductive layers of these metals having 50 to 60% light transmission have a surface resistivity of about 100 times the surface resistivity of a similar layer of nickel. Silver and gold have less surface resistivity than nickel for conductive layers having 50 to 60% light transmission (i.e. less than 10 ohms per square), however these metals are prohibitively costly for most applications.

Additionally several metallic compounds have been tested and appear useful as material for the conductive layer. Included in these compounds are tin and indium oxides, cuprous chloride and cuprous iodide. Layers of such metal compounds are generally more optically transparent and abrasion resistant than the metal from which they are formed.

When the conductive coating is of metal it is preferred that the sheet have a layer of abrasion resistant material over the surface of the conductive layer opposite the polymeric sheet, which layer of abrasion resistant material is sufficiently tough to restrict abrasion of the conductive layer, and yet provides a surface conductivity on the first surface of the sheet material (which first surface defines the outer surface of the envelope and is itself defined by the abrasion resistant material) which is not substantially less than would be the surface conductivity of the conductive layer itself. U.S. Pat. No. 3,118,781 (the content whereof is incorporated herein by reference) teaches the use of and a method for applying an ultrathin (i.e. less than 0.15 micrometers thick) continuous transparent film of resin over a metal layer to provide abrasion protection for the metal layer. In addition to providing abrasion resistance, the use of an ultrathin continuous film of resin as taught in that patent to define the first surface of the sheet material has been found to afford the high surface conductivity resulting from the conductive metal layer which is required for the sheet material. Preferably, (as taught in U.S. Pat. No. 3,118,781) the resin in the abrasion resistant layer is a copolyester of terephthalic acid and isophthalic acid (about equal parts each) with ethylene glycol, and is applied to the conductive coating to provide the abrasion resistant layer from solution in cyclohexanone at a solids concentration of about 1.5% by weight. However, abrasion resistant layers formed by application of the resin from a solution in cyclohexanone at a solids concentration of as little as 0.75% by weight have also been found suitable.

BRIEF DESCRIPTION OF THE DRAWING

The invention will be further described with reference to the accompanying drawing where like numbers refer to like parts in the several views, and wherein.

DESCRIPTION OF THE PREFERRED EMBODIMENT

Figure 1:
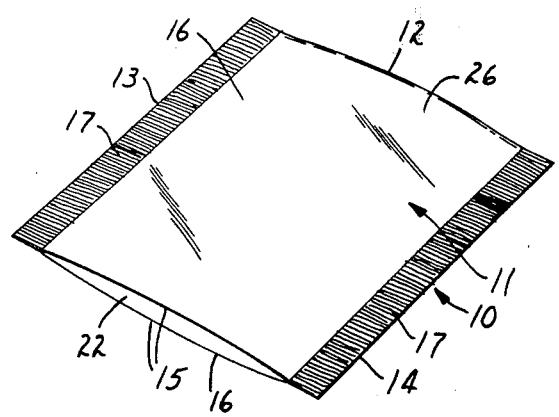
FIG. 1 is a perspective view of an envelope for protecting an electronic component formed of the sheet material according to the present invention.

Referring now to FIG. 1 there is shown an envelope 10 formed from a first embodiment of a transparent coated flexible polymeric sheet or sheet material 11 according to the present invention. The envelope 10 is rectangular in shape and formed by folding the sheet material 11 once upon itself at a fold line 12 to bring into alignment edges 13, 14 and 15 of opposed walls 16 of the envelope 10 thus formed and to define an inner surface and an outer surface of the envelope 10. Edge portions 17 of the walls 16 are fused together as by heat sealing adjacent the parallel edges 13 and 14 disposed normal to the fold line 12 to form the envelope 10, while providing an opening into the envelope 10 between the pair of aligned edges 15. An electronic component 18 may be inserted into the envelope 10 between the aligned edges 15, and then portions 19 of the walls 16 adjacent the aligned edges 15 may be fused together as by heat sealing to seal the component 18 in the envelope 10 as is shown in FIG. 2.

Figure 2:
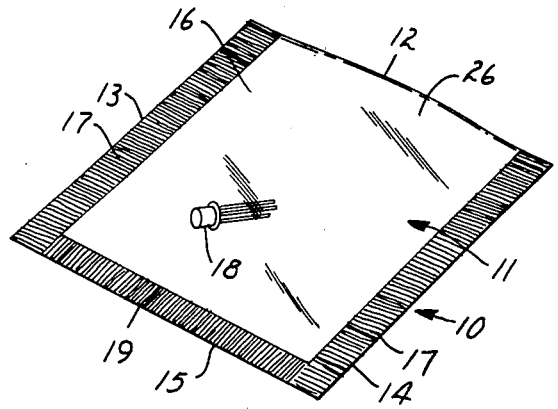
FIG. 2 is a perspective view of the envelope of FIG. 1 in which an electronic component to be protected has been inserted and sealed.
Figure 3:
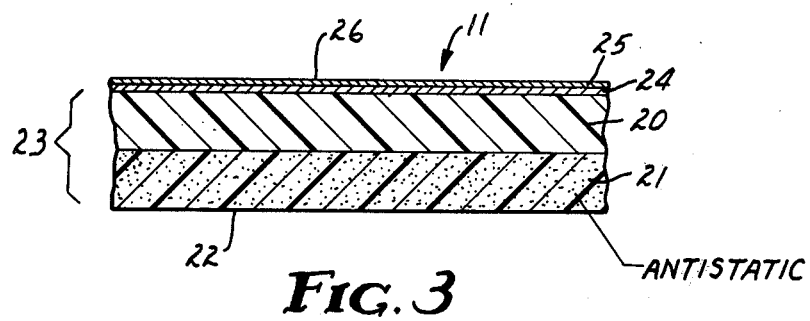
FIG. 3 is an enlarged fragmentary sectional view of a first embodiment of the sheet material according to the present invention.

The structure of the sheet material 11 forming the walls 16 of the envelope 10 is best seen in FIG. 3. The material 11 includes a polymeric sheet 23 comprising a support layer 20 of strong self supporting flexible electrically nonconductive polymeric material (e.g. polyester) which contains no antistatic material and a fusible layer 21 of thermoplastic heat sealable polymeric material which defines a second surface 22 of the material 11 disposed as the inner surface of the envelope 10 and contains an antistatic material in an amount to provide a resistivity in the range of $10^8$ to $10^{14}$ ohms per square on the inner surface of the envelope 10. The thermoplastic heat sealable polymeric material of the fusible layer 21 is fused together in the areas 17 (FIG. 1) to form the envelope 10 and can be fused together in the areas 19 to seal the envelope (FIG. 2). Such fusing should provide electrical continuity on the inner surface of the envelope 10 across the fused areas 17 and 19. However, since the sheet material 11 is folded upon itself the electrical continuity of the inner surface of the envelope 10 between the two walls 16 will in all cases be maintained across the fold line 12 in the sheet 15 without dependence upon conductivity across the surface of the heat fused areas 17 and 19.

A conductive layer 24 of electrically volume conductive material (e.g. metal or metal containing compounds) is disposed on the side of the support layer 20 opposite the second surface 22 of the sheet material 11 and a thin abrasion resistant layer 25 of a tough resinous material is disposed on the surface of the conductive layer 24 opposite the support layer 20. The abrasion resistant layer 25 defines a first surface 26 of the sheet material 11 disposed as the outer surface of the envelope 10, and is ultrathin (i.e. less than 0.15 micrometers) so that the surface resistivity of the first surface 26 due to the conductive layer 24 will be no greater than $10^8$ ohms per square. Since the envelope 10 is formed of only one sheet of the sheet material 11 its outer surface has electrical continuity between all of its portions due to the continuous conductive layer 24. The layers 20, 21, 24 and 25 are sufficiently transparent to afford visual identification of an electronic component within the envelope 10 through the sheet material 11.

Figure 4:
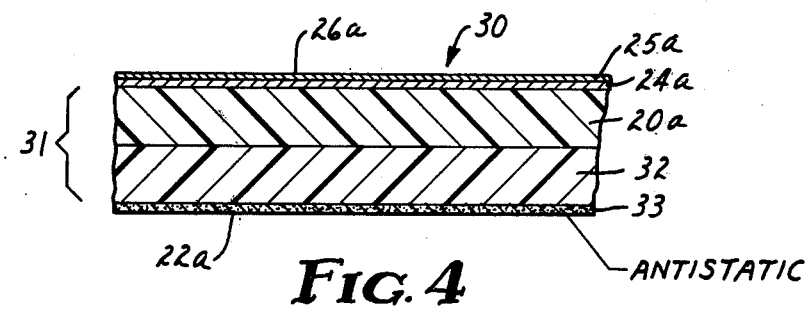
FIG. 4 is a fragmentary sectional view of a second embodiment of the sheet material according to the present invention.

FIG. 4 illustrates a second embodiment of a sheet material 30 according to the present invention adapted for forming an envelope of the type illustrated in FIGS. 1 and 2, in which sheet material 30 layers and surfaces corresponding to those of the sheet material 11 illustrated in FIG. 3 are similarly numbered except for the addition of the suffix "a".

Like the sheet material 11, the sheet material 30 comprises a polymeric sheet 31 including a supporting layer 20a of a self supporting flexible electrically non-conductive polymeric material having on one surface a conductive layer 24a of volume conductive sheet material. Also the material 30 has an ultrathin abrasion resistant layer 25a of a tough resin on the surface of the conductive layer 24a opposite the support layer 20a. The abrasion resistant layer 25a provides a first surface 26a for the sheet material 30 adapted to be disposed as the outer surface of an envelope, which first surface 26a has a surface resistivity due to the conductive layer 24a of no greater than $10^8$ ohms per square. Also the polymeric sheet 31 includes a fusing layer 32 of non-conductive polymeric material which is thermoplastic and heat sealable and disposed over the surface of the support layer 20a opposite the conductive layer 24a. Unlike the sheet material 11 of FIG. 1, however, the fusing layer 32 contains no antistatic material. Instead there is a thin layer 33 of antistatic material on the surface of the fusing layer 32 opposite the conductive layer 24a. The layer 33 of antistatic material defines a second surface 22a for the sheet material 30 adapted to be disposed as the inner surface of an envelope, which second surface 22a has a surface resistivity in the range of $10^8$ to $10^{14}$ ohms. In combination the layers 20a, 24a, 25a, 32, and 33 are sufficiently transparent to afford visual identification of an electrical component through the sheet material 30.

Figure 5:
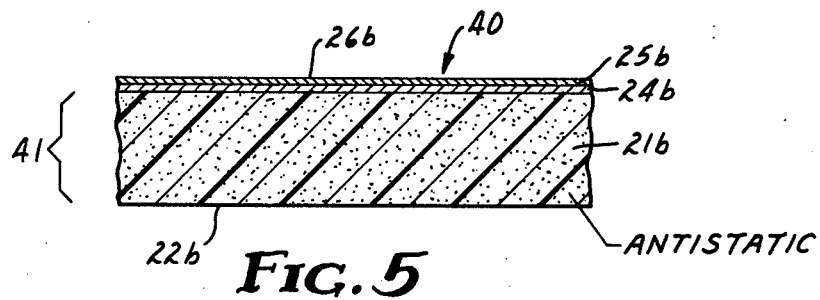
FIG. 5 is a fragmentary sectional view of a third embodiment of the sheet material according to the present invention.

FIG. 5 illustrates yet a third embodiment of a sheet material 40 according to the present invention adapted for forming an envelope of the type illustrated in FIGS. 1 and 2, in which sheet material 40 layers and surfaces corresponding to those illustrated in FIG. 3 are similarly numbered except for the addition of the suffix "b".

Like the sheet material 11 of FIG. 3 the sheet material 40 of FIG. 5 includes a polymeric sheet 41, however the polymeric sheet 41 consists only of a layer 21b of thermoplastic sheet material 40 defining a second surface 22b of the material adapted to be disposed as an inner surface of an envelope, and containing an antistatic material in an amount to provide a resistivity in the range of $10^8$ to $10^{14}$ ohms per square on the second surface 22b. The material 40 also includes a layer 24b of electrically volume conductive material (e.g. metal or metal containing compounds) disposed on the side of the layer 21b opposite the second surface 22b, and an abrasion resistant layer 25b of a tough resin disposed on the surface of the layer 24b of conductive material to define a first surface 26b of the sheet material 40 adapted to provide an outer surface for an envelope. The abrasion resistant layer 25b is ultrathin and of a material such that the surface resistivity of the envelope's outer surface 26b due to the layer of conductive material 24b will be no greater than $10^8$ ohms per square. Additionally, as with the sheet material 11 and 30 of FIGS. 3 and 4, the layers 21b, 24b and 25b of the sheet material 40 of FIG. 5 are sufficiently transparent to afford visual identification of an electrical component through the sheet material 40.

The following is an example of a method that has been used to manufacture the sheet material according to the present invention in the embodiment illustrated in FIG. 3.

A 0.75 mil thick sheet of biaxially oriented polyester film (layer 20) was coated on one surface with nickel (layer 24) by vapor deposition until light transmission through the nickel coated polyester compared to light transmission through air was in the range of 60 to 66% for light centered about 550 to 650 nanometers in wave length and produced by an 150 watt incandescent bulb (e.g. frosted extended life bulb by General Electric) when measured by a Diffused Silicon Detector with a Commission Internationale de 1-Exchairage correcting filter such as the model 1222 detector sold by United Detector Technology, Santa Monica, California. The exposed surface of the layer of nickel was then coated by the following process with a copolyester of terephthalic acid and isophthalic acid (in about equal parts) with ethylene glycol in solution in cyclohexanone at a solids concentration by weight of about 1.5 percent. The solution was first applied to the exposed surface of the layer of nickel by moving the nickel coated polyester at about 50 feet per minute over a casting roll and past a fountain roll spaced about 10 mils from the surface of the nickel coating. The fountain roll picked up the solution from an open pan and applied more solution than was required to make the abrasion resistant coating. The solution and nickel coated polyester was then passed adjacent a metering roll having an adjacent surface spaced 2 mils from the nickel layer and having a surface of 70 feet per minute in a direction opposite that of the nickel coated polyester. The solvent was then removed by air drying in an oven at 150° F. to produce an abrasion resistant coating (layer 25) about 0.15 micrometers thick.

A mixture by weight of 97 percent low-density polyethylene (DFDA 3300 from Union Carbide) and 3 percent antistatic material (No. 10069 antistatic pellets from Ampacet) was extruded from an extruder having a 1½ inch standard polyethylene type screw running at 80 R.P.M. through a film die at 525° F. vertically onto the exposed surface of the polyester opposite the nickel coating, which exposed surface was spaced 2.25 inches from the die and moving horizontally at 40 feet per minute to produce a 1.5 mil coating (layer 21) of polyethylene and antistatic sheet material. The material was then passed under ultraviolet lamps adjacent the polyethylene and antistatic material layer to improve its bond to the polyester.

The surface resistivities of the resultant sheet material were measured as about $10^{12}$ ohms per square on the polyethylene and antistatic material layer, and about $10^4$ ohms per square on the abrasion resistant coating.

Tests were run on the sheet material thus prepared to compare its protective properties against those of commercially available prior art sheet materials used to form envelopes for protecting electronic components. About 2 inch × 10 inch rectangular samples were taken of the sheet material according to the present invention and of a sheet material designated Richmond RC AS-1200 available from Richmond Corp., Div. of Pak-well, Redlands, California, and represented to be 4 mil thick transparent polyethylene filled with antistatic material (called antistatic filled polyethylene hereafter) so that both of its surfaces are antistatic. Different samples of each sheet material to be tested were conditioned for 24 hours in chambers at 10%, 20% and 40% relative humidity. Each sample was then electrostatically charged and discharged to ground and the rate of discharge under those conditions measured by a technique which, except for the size of the sheet material sample tested, was the same as Federal Test Method Standard No. 101B, Method 4046.

Figure 6:
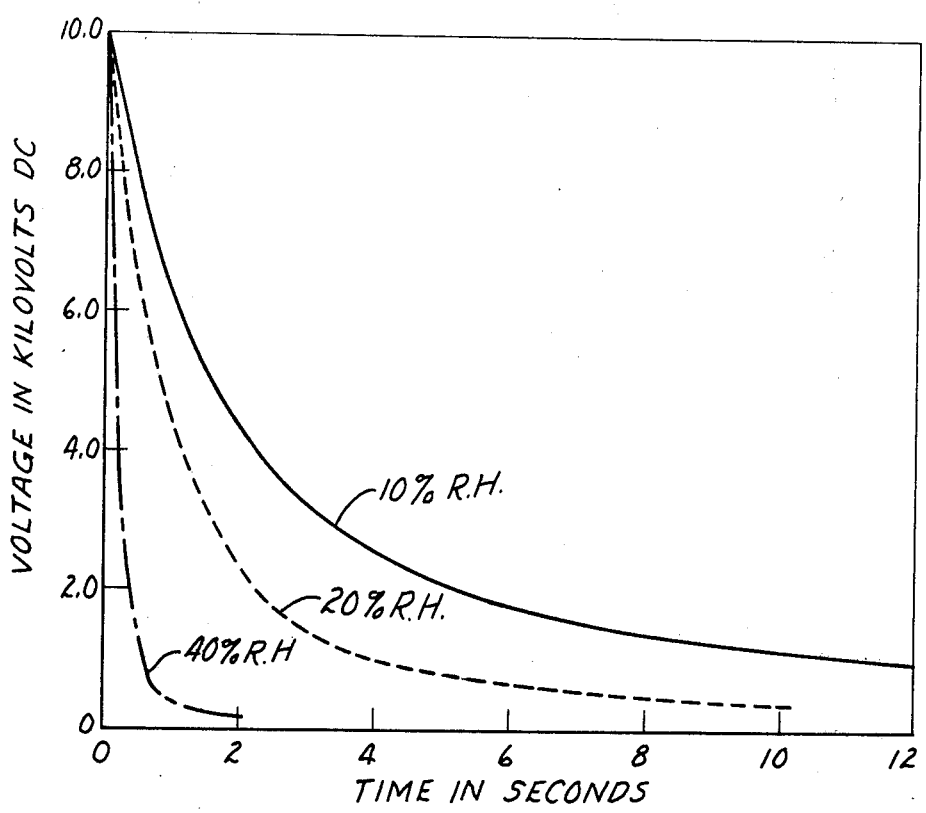
FIGS. 6, 7 and 8 are graphs of comparative data between the present invention and the prior art.
Figure 8:
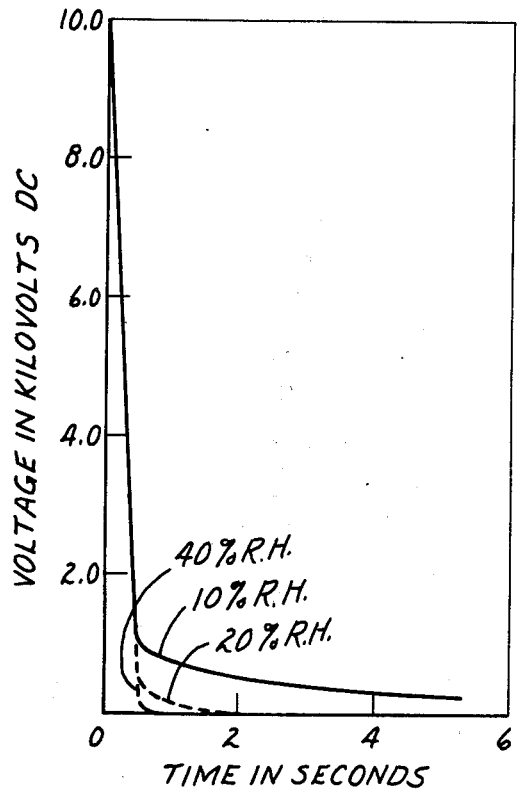
Figure 7:
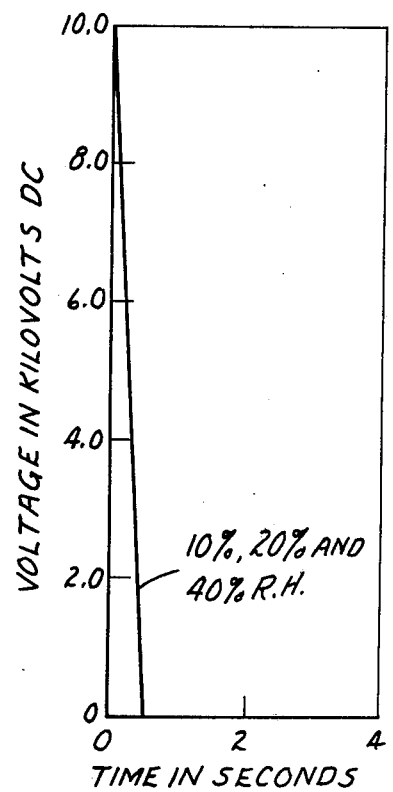

The discharge rates of the samples of antistatic filled polyethylene when either one of their surfaces were grounded are shown in FIG. 6; the discharge rates of the samples of sheet material according to the present invention when their first surfaces (surfaces adjacent their conductive layers) were grounded are shown in FIG. 7; and the discharge rates of the samples of sheet material according to the present invention when their antistatic surfaces were grounded are shown in FIG. 8. The discharge rates upon grounding either of the surfaces of the samples of sheet material according to the present invention were faster than the discharge rates upon grounding one of the surfaces of the samples of the antistatic filled polyethylene for those samples preconditioned at below 40% relative humidity. This showed that at relative humidities below 40% the sheet material according to the present invention provides better protection for components than do envelopes of antistatic filled polyethylene.

Tests were also made of the shielding effect of protective envelopes made of the sheet material according to the present invention in comparison with envelopes made from the antistatic filled polyethylene, and from a third material which is a carbon filled polyolefin plastic commercially designated "Velostat 1704" and available from Minnesota Mining and Manufacturing Co. of St. Paul, Minnesota.

A test device was provided by fastening the leads of a small neon filled bulb, (commercially designated NE-2) to the opposite surfaces of an about 2½ inch ×4 inch board comprising conductive copper layers forming both surfaces and an electrically insulating layer separating the copper layers. It was found that the bulb of the test device could be flashed by a potential between the copper layers of as little as 90 volts.

The test device was used to test envelopes made of single folded sheets of each of the aforementioned sheet materials. The device was placed in the envelope being tested, and that envelope was then laid on a conventional wooden table. A charge was developed on an individual by that individual shuffling his feet on a polyester carpet, after which that individual touched the upper surface of the envelope with his index finger. A flash of the bulb indicated that the test device within the envelope had received at least a 90 volt gradient which gradient could potentially damage a sensitive component in the envelope; whereas no flash indicated that no damaging gradient had been received within the envelope. A small hole was made in each of the envelopes of the carbon loaded sheet material so that any flashing of the bulb could be observed, whereas envelopes of both the sheet material according to the present invention and of the antistatic filled polyethylene were sufficiently transparent that any flashing of the bulb could be observed through the envelopes.

No flashing of the bulb was observed when the testing device was protected by an envelope made of sheet material according to the present invention or by an envelope made of the carbon filled polyolefin. The bulb did flash, however, when the envelope was made of the antistatic filled polyethylene. While under these test conditions, the carbon filled polyolefin provided the same protection as the sheet material according to the present invention, the carbon loaded material did not afford visual identification of a component through the envelope.

We claim:

1. A flexible sheet material having first and second major surfaces adapted for forming an envelope with said second surface defining the inner surface of the envelope, which envelope can receive and electrically protect an electronic component, said sheet material comprising a self-supporting electrically insulating polymeric sheet having a volume resistivity of at least about $10^{10}$ ohm-centimeters, an organic antistatic material providing a surface resistivity on said second surface in the range of $10^8$ to $10^{14}$ ohms per square, and a conductive layer on the surface of said polymeric sheet opposite said second surface providing a surface resistivity on said first surface of no greater than $10^4$ ohms per square, said sheet material being sufficiently transparent to afford visual identification of an electrical component through the sheet material.

2. A sheet material according to claim 1, wherein said polymeric sheet comprises a thermoplastic heat sealable material.

3. A sheet material according to claim 1, wherein said polymeric sheet consists only of a thermoplastic heat sealable material and wherein said antistatic material is throughout said heat sealable material.

4. A sheet material according to claim 1, wherein said polymeric sheet comprises a layer of polyester in contact with said conductive layer and a layer of thermoplastic heat sealable material defining said second surface and disposed on the surface of said layer of polyester opposite said conductive layer, and wherein said antistatic material is throughout said layer of heat sealable material.

5. A sheet material according to claim 4, wherein said conductive layer is of metal and said material further comprises an ultrathin abrasion resistant layer of a resinous material over the surface of said conductive layer opposite said second surface.

6. A sheet material according to claim 5, wherein said metal is nickel.

7. A sheet material according to claim 1, wherein said polymeric sheet comprises a layer of polyester in contact with said conductive layer and a layer of thermoplastic heat sealable material disposed on the side of said layer of polyester opposite said conductive layer, and wherein said antistatic material is in a layer defining said second surface and disposed on the surface of said layer of heat sealable material opposite said layer of polyester.

8. A sheet material according to claim 7, wherein said conductive layer is of metal and said material further comprises an ultrathin abrasion resistant layer of a resinous material over the surface of said conductive material opposite said second surface.

9. A sheet material according to claim 8, wherein said metal is nickel.

10. A sheet material according to claim 1, wherein said sheet material has a light transmission of at least 60% between said first and second surfaces.

* * * * *